United States Patent [19]

Lauerman

[11] 4,124,814
[45] Nov. 7, 1978

[54] MAGNETIC DISPLACEMENT TRANSDUCER WHEREIN TWO RELATIVELY MOVABLE GRATINGS VARY THE MAGNETIC FIELD COUPLED TO A HALL PLATE PROPORTIONAL TO THE DISPLACEMENT

[75] Inventor: Albert L. Lauerman, Orange, Calif.

[73] Assignee: Rockwell International Corporation, El Segundo, Calif.

[21] Appl. No.: 839,064

[22] Filed: Oct. 3, 1977

[51] Int. Cl.² ............................................. G01R 33/12
[52] U.S. Cl. .................................... 324/208; 324/251; 338/32 H
[58] Field of Search ............... 324/207, 208, 251, 252, 324/173–175; 338/32 R, 32 H; 323/94 H; 310/DIG. 3; 340/195, 196, 365 L, 347; 250/237 G

[56] References Cited

U.S. PATENT DOCUMENTS

| 2,882,516 | 4/1959 | Neergaard | 324/208 |
| 3,243,692 | 3/1966 | Heissmeier et al. | 324/208 |
| 3,286,161 | 11/1966 | Jones et al. | 324/207 |
| 3,471,844 | 10/1969 | Schugt | 340/196 |
| 3,582,769 | 6/1971 | Brandenburg | 324/208 |
| 3,787,769 | 1/1974 | Parkinson | 324/174 |

FOREIGN PATENT DOCUMENTS 1,353,606   5/1974   United Kingdom ..................... 324/173

Primary Examiner—Robert J. Corcoran
Attorney, Agent, or Firm—H. Fredrick Hamann; G. Donald Weber, Jr.; Morland C. Fischer

[57] ABSTRACT

A compact linear transducer assembly including a Hall effect semiconductor material, which material generates a variable voltage as a result of displacing an array of gratings, formed in a first, highly permeable magnetic plate, in a magnetic field relative to the Hall effect material and to a corresponding array of gratings, formed in a second, highly permeable magnetic plate. A counter is responsive to the voltage across the Hall effect material to provide an indication of the linear distance traveled by the movable grating plate.

10 Claims, 8 Drawing Figures

MAGNETIC DISPLACEMENT TRANSDUCER WHEREIN TWO RELATIVELY MOVABLE GRATINGS VARY THE MAGNETIC FIELD COUPLED TO A HALL PLATE PROPORTIONAL TO THE DISPLACEMENT

BACKGROUND OF THE INVENTION

1. Field of the Invention

This invention relates to a Hall effect linear transducer of reduced size and power consumption, wherein gratings formed in a first magnetic plate are moved through a magnetic field relative to a Hall effect element and to gratings formed in a second magnetic plate in order to provide an indication of a linear dimension.

2. Statement of the Prior Art

Classical precision dimensional measuring devices utilize either lead screws and verniers or electronic indicators with analog type meters. These well known measuring devices are relatively difficult to operate and to read, have limited range, and provide relatively slow response times. Moreover, as a consequence of thread or gear wear, linearity errors may be introduced, thereby resulting in diminished reliability. What is more, many conventional electronic amplifier comparators operate with transducing characteristics which require a.c. line adaptability. This limits mobility and flexibility of transducer application. Otherwise, existing electro-mechanical linear transducers require too much power to be operated by batteries of suitable size. The aforementioned disadvantages are due, primarily, to the type of transducer utilized (e.g. a variable reluctance differential transformer type transducer usually requires a considerable amount of complex circuitry and large space consumption).

Particular examples of prior art displacement indicating devices which include a Hall effect transducing element arranged within a magnetic circuit are disclosed by the following U.S. Pat. Nos.: 3,164,013 Jan. 5, 1965, 3,195,043 July 13, 1965, 3,226,631 Dec. 28, 1965, 3,264,416 Aug. 2, 1966, 3,596,189 July 27, 1971, 3,906,359 Sept. 16, 1975, 3,835,373 Sept. 10, 1974.

However, none of the prior art patents listed above shows or discloses a magnetically operated linear transducer assembly including a first magnetic grating plate which moves in a magnetic field relative to a second, stationary magnetic grating plate and to a Hall effect element to produce a differential voltage signal across the Hall effect element so as to provide an indication of a linear displacement.

SUMMARY OF THE INVENTION

Briefly, and in general terms, a compact, power saving Hall effect linear transducer assembly is disclosed. The transducer comprises the interconnection of a magnet means, a reader assembly, and a probe assembly. The reader assembly includes a reader armature plate having a Hall effect element attached thereto. A magnetic shunt plate is formed with a centrally disposed opening to receive the Hall effect element. A highly permeable magnetic plate, fabricated with uniformly spaced bars and apertures, and the shunt plate are cemented to the reader armature plate to complete the reader assembly. The probe assembly also includes a highly permeable magnetic plate fabricated with uniformly spaced bars and apertures. This magnetic plate is cemented to a probe armature plate to complete the probe assembly.

In operation, the probe assembly is displaced relative to the stationary reader assembly within a magnetic field created by the magnet means. A differential voltage signal is provided across the Hall effect element whenever magnetic flux line paths are established through the reader and probe assemblies as a result of aligning the apertures of the movable probe assembly grating plate with the apertures of the stationary reader assembly grating plate. The displacement of the apertures of the movable plate relative to those of the stationary plate shapes the magnetic field through the Hall effect element to vary the corresponding differential voltage signal thereacross. Counter and display means can be provided to be responsive to the Hall effect differential voltage signal for supplying an indication of the linear distance traveled by the movable probe assembly grating plate.

DESCRIPTION OF THE PREFERRED EMBODIMENT

Figure 1:
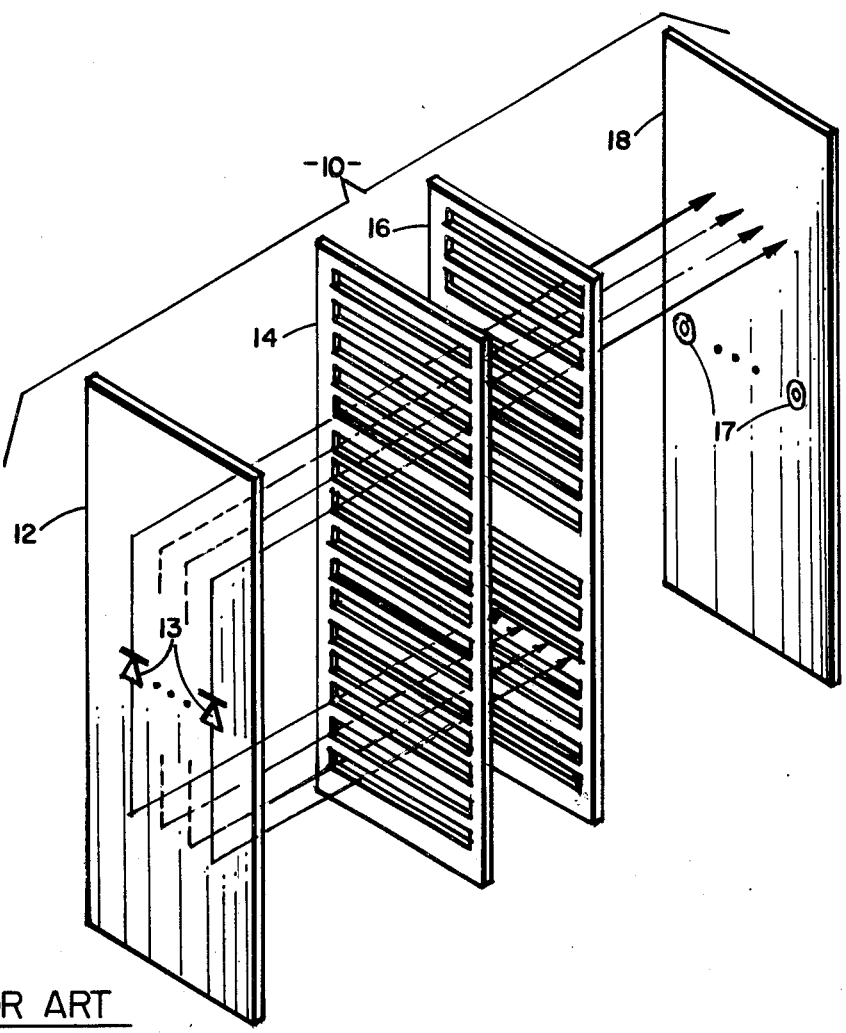
FIG. 1 is an example of a prior art optical transducer assembly.

Another example of a prior art dimensional measuring device is illustrated in FIG. 1. FIG. 1 relates to an optical transducer assembly 10 including an energy source plate 12, a movable grating plate 14, a fixed reader grating phase plate 16, and a detector plate 18. The energy source plate 12 typically includes an array of (e.g. four) light emitting diodes 13. The detector plate 18 typically includes a corresponding array of (e.g. four) photo-detectors 17.

Briefly, the operation of the prior art optical transducer assembly 10 is described as follows. The movable grating plate 14 and the fixed reader grating phase plate 16 are twisted or misaligned relative to one another, when arranged in the transducer assembly 10. Initially, a null point is achieved when bars from the movable plate 14 are aligned with bars from the fixed plate 16 so that maximum illumination is transmitted from the light emitting diode source 13 to the photo-detectors 17 via apertures formed between the bars in plates 14 and 16.

However, as the transducer 10 is utilized to measure a particular dimension, the position of the movable grating plate 14 is, accordingly, changed relative to the position of the fixed reader grating plate 16. As a result of the twisted nature of plate 14 with respect to plate 16, when the bars of plate 14 are moved out of alignment with the bars of plate 16, the light emitting diode energy source 13 produces moire fringe patterns on detector plate 18. The moire fringe patterns provide an amplified optical indication of the linear displacement of the movable grating plate 14. The photo-detectors 17 are responsive to the changing light intensity caused by the moire fringe patterns to, thereby, generate corresponding digital signal indicative of the change in position of the movable grating plate 14. The digital signals have greater resolution than the line/space dimensions of the bars and apertures of plates 14 and 16. The digital signals are applied from the array of photo-detectors 17 to a counter apparatus (not shown) so that an indication of the relative magnitude and direction of motion of plate 14 with respect to plate 16 is obtained. The counter usually includes a display means (also not shown) whereby the transducer operator receives a read out representative of the dimension to be measured. However, as is known to those skilled in the art, the optical transducer assembly 10 consumes a relatively large amount of power and has a relatively slow response to the displacement of movable grating plate 14.

Figure 2:
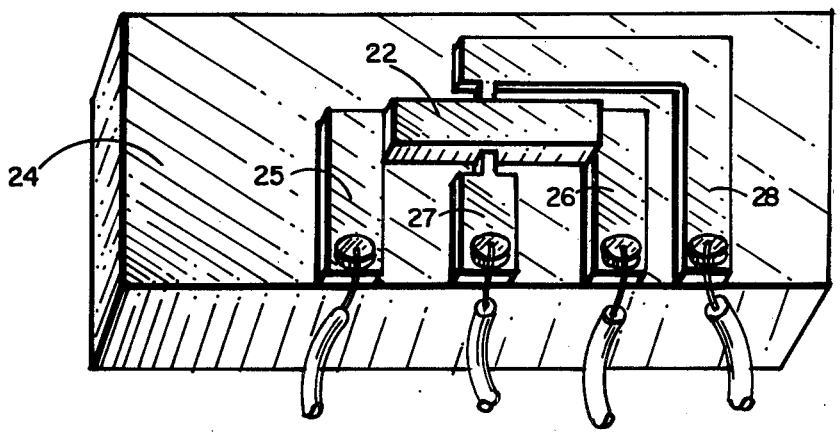
FIG. 2 shows a Hall effect element and the respective current source and voltage sensing terminals thereof disposed upon the reader armature substrate to form the stationary reader assembly for a first embodiment of the presently disclosed linear transducer.
Figure 3:
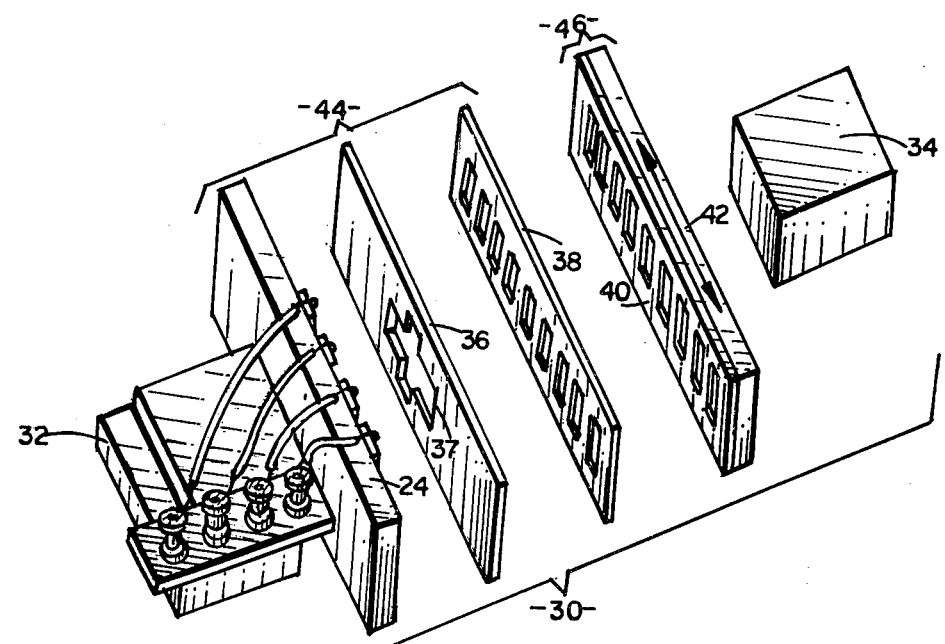
FIGS. 3 and 4 are exploded views of the stationary reader and movable probe assemblies which form the first embodiment of the Hall effect linear transducer of the present invention.
Figure 4:
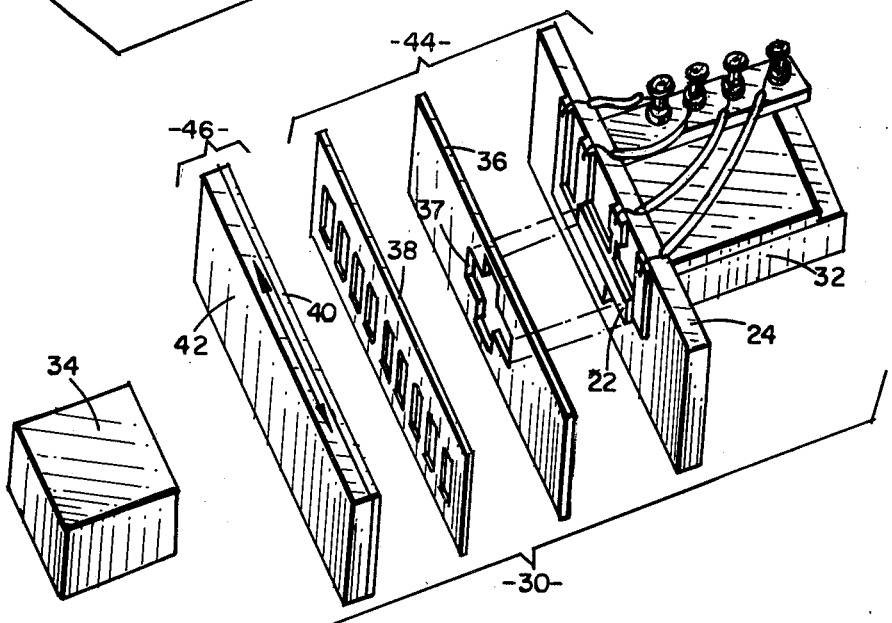

A first preferred embodiment of the Hall effect transducer of the present invention for measuring a linear dimension is illustrated in FIGS. 2-4. Referring to FIG. 2, a Hall effect element 22 is shown disposed upon a reader armature substrate 24. By way of example, the Hall effect element is formed from a suitable semiconductor material, such as Indium Arsenide, or the like. An insulating material (e.g. tape) is wrapped around the reader armature 24. Conductor strips 25 and 26, having respective current source terminals, are aligned with the longitudinal axis of the Hall effect element 22 in order to supply a current therethrough. Conductor strips 27 and 28, having respective voltage output terminals, are aligned with the transverse axis of the Hall effect element 22 in order to sense a corresponding Hall differential voltage thereacross. Typically, conductor strips 25-28 are aluminum foil depositions that are laminated to the insulating material of the reader armature 24. The Hall effect element 22 is cemented into electrical contact with conductors 25-28.

FIGS. 3 and 4 represent exploded views of the instant Hall effect linear transducer 30, FIGS. 3 and 4 being rotated relative to one another by 180°. A magnetic field is generated by a pair of conventional permanent N-S pole magnets 32 and 34. However, any other suitable permanent or electro-magnetic source may also be used. Pole magnet 32 is connected to the reader armature 24. Pole magnet 34 is connected to a probe armature 42. Armatures 24 and 42 are fabricated from a suitable permeable, soft iron material. A stationary magnetic shunt plate 36, a stationary reader grating plate 38, and a movable probe grating plate 40 are each fabricated from a highly permeable material, such as, for example, mu-metal. Grating plates 38 and 40 are machined to include a suitable plurality of uniformly spaced bars which are separated from one another by a corresponding plurality of uniformly spaced apertures. The shunt plate 36 is machined to include a centrally disposed opening or slot 37, which opening is dimensioned to receive the Hall effect element 22 so that shunt plate 36 encases Hall effect element 22 when the linear transducer 30 is assembled. The reader grating 38 and the shunt plate 36 are cemented to the reader armature 24. To provide a proper reference surface, the edges of the reader grating 38 and the shunt plate 36 are aligned with the edges of the reader armature 24. The stationary reader grating 38, the shunt plate 36 and the reader armature 24, to which the Hall element 22 is connected, form a magnetic Hall effect reader assembly 44 of the present linear transducer 30. The probe armature 42 and the movable probe grating 40 are aligned with one another and cemented together to form a magnetic probe assembly 46 of the present linear transducer 30. The pole magnets 32 and 34 are attached to the reader and probe armatures 24 and 42, respectively. The use of pole magnets 32 and 34 as a source of the magnetic field helps to significantly reduce the power demand of the transducer assembly 30 to a relatively low level so that batteries (as well as an a.c. source) can be connected to the terminals of conductor strips 25 and 26 (of FIG. 2) to supply a d.c. current through the Hall effect element 22. Magnets 32 and 34 and the reader and probe assemblies 44 and 46 are interconnected to form the presently disclosed Hall effect linear transducer 30.

The operation of the Hall effect linear transducer 30 is described as follows. Initially, the reader grating plate 38 and the probe grating plate 40 are aligned with one another so that the bars of plate 38 are adjacent the apertures in plate 40. In this initial condition, maximum shielding of the Hall effect element 22 is obtained, and the magnetic field generated by magnets 32 and 34 is effectively shunted around the Hall effect element 22 by means of shunt plate 36. Thus, a null or zero reference position is established. When a linear dimension is measured, the magnetic probe assembly 46 and the pole magnet 34 are displaced relative to the Hall effect reader assembly 44 by means of a micrometer (not shown), or the like, connected thereto. Therefore, the apertures in the movable probe grating plate 40 are moved into alignment with the apertures in the stationary reader grating plate 38. This alignment allows the magnetic flux line paths to pass through the apertures formed in grating plates 38 and 40 and the central opening 37 in shunt plate 36 to penetrate the Hall effect material. The particular position of the bars of probe plate 40 with respect to the bars of reader plate 38 act to shape the magnetic field generated by the pole magnets 32 and 34 and control the flux density through the Hall effect element 22.

A small current is applied (via conductor strips 25 and 26 as best illustrated in FIG. 2) through the Hall effect element 22 in order to provide a uniform flow of electrons through the Hall effect semiconductor material. A Hall effect voltage is provided whenever a magnetic flux path is established through the Hall effect reader and probe assemblies 44 and 46, as a result of a linear displacement of the bars formed in the movable probe grating plate 40 relative to the bars formed in the stationary reader grating plate 38. A measurable Hall effect voltage can be detected (between contacts 27 and 28, as best illustrated in FIG. 2) across the Hall effect element 22, by virtue of the magnetic flux path varying the cross section electron distribution within the Hall effect semiconductor material.

Figure 5:
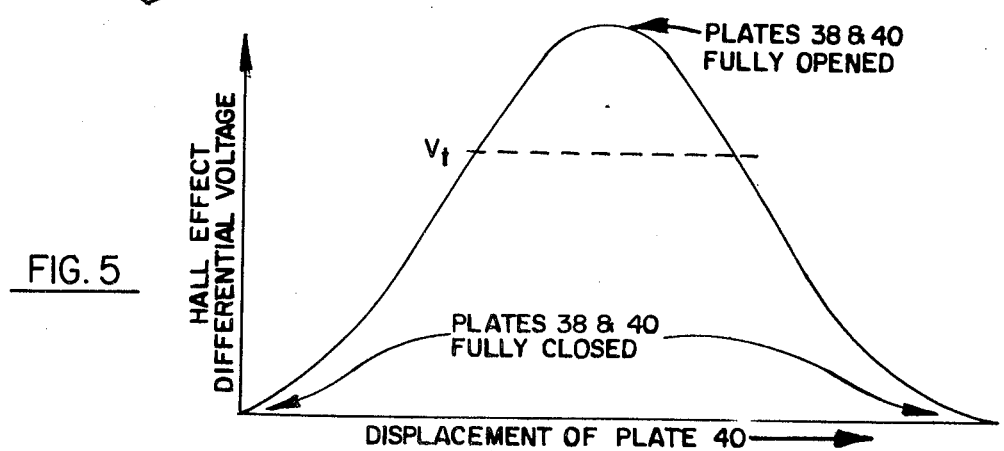
FIG. 5 represents the distribution of the differential voltage that can be sensed across the Hall effect element of FIG. 2 as a result of displacing the movable probe assembly relative to the stationary reader assembly through a distance equal to the width of one aperture.

Referring concurrently to FIGS. 3-5, FIG. 5 shows the distribution of the Hall effect differential voltage that is sensed across the Hall effect device 22 as a result of moving a bar, formed in the movable probe grating plate 40, past an aperture, formed in the stationary reader grating plate 38, when a linear dimension is measured. The Hall effect voltage is substantially proportional to the strength of the magnetic field that is leaked through shunt plate 36 and grating plates 38 and 40 to the Hall effect device 22. Thus, whenever grating plates 38 and 40 are aligned with one another in a closed, shielded position (.e. a bar in plate 40 is positioned adjacent an aperture in plate 38) so that the magnetic lines of flux are shunted around the Hall effect element 22, the Hall effect voltage that is measured is equivalent to a reference zero or null level. The Hall effect voltage increases as the movable probe grating plate 40 is displaced relative to the stationary reader grating plate 38. When the aperture formed in grating plates 38 and 40 are aligned in an opened, unshielded position (i.e. an aperture in plate 40 is positioned adjacent an aperture in plate 38) so that the magnetic lines of flux pass therethrough to the Hall effect element 22, the corresponding Hall effect voltage is maximized. With the continued displacement of the bars formed in the movable probe grating plate 40 to a shielded position with respect to the apertures formed in the stationary reader grating plate 38, the corresponding Hall effect voltage will diminish towards the reference zero level.

A suitable counter means (not shown) may be utilized to be responsive to certain threshold levels $V_t$ of the Hall effect voltage signal. As the Hall effect voltage passes a threshold level, the counter is triggered to, thereby, providing a digital representation of the number of apertures and, hence, the distance displaced by movable probe grating plate 40. Accuracy of measurement is determined by the number and spacing of the bars formed in the magnetic plates 38 and 40. The voltage signals, provided to the counter by the Hall effect linear transducer 30 of the present invention, are also suitable to be applied to a display means, such as, for example, a conventional hand held calculator display. Thus, the display provides a digital readout of the distance traveled by the movable probe grating plate 40 relative to the stationary reader grating plate 38 so as to accurately indicate a linear dimension sensed by the transducer 30.

Figure 6:
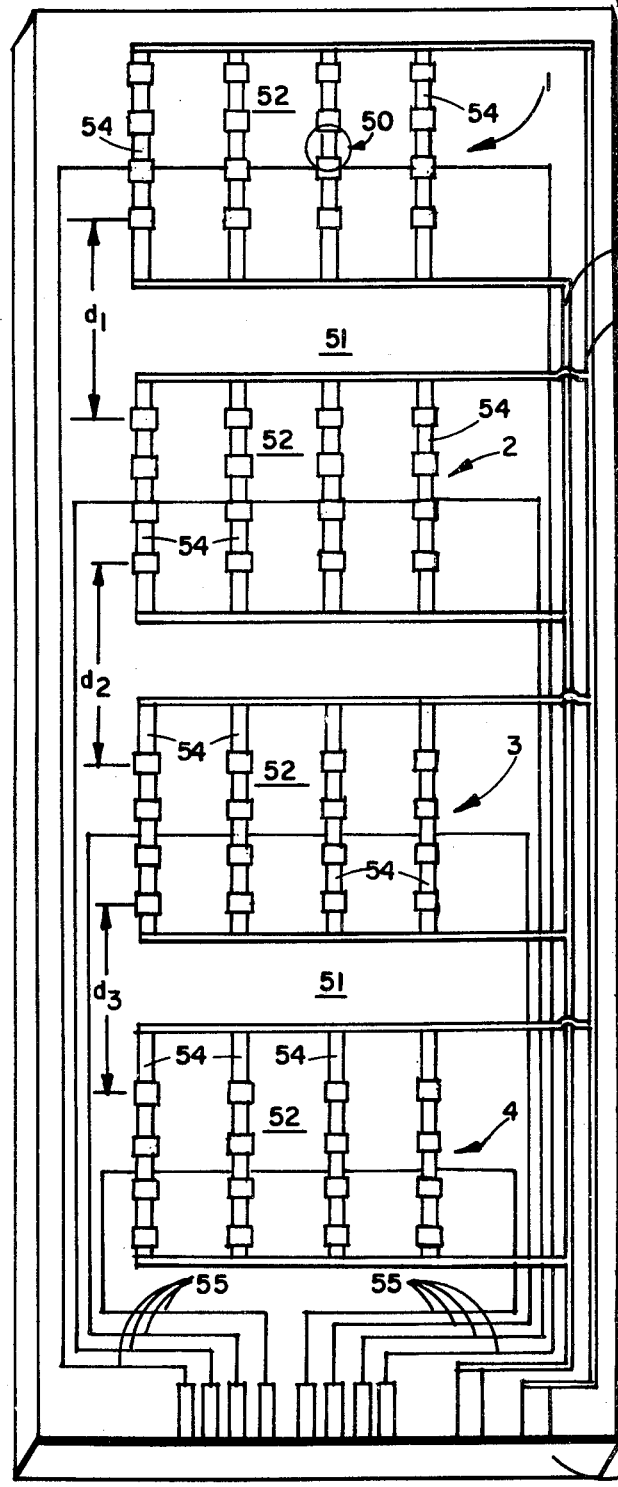
FIG. 6 shows a Hall effect reader assembly, fabricated by microelectronic technology, in order to form a Hall effect linear transducer of reduced size and in accordance with another embodiment of the present invention.
Figure 7:
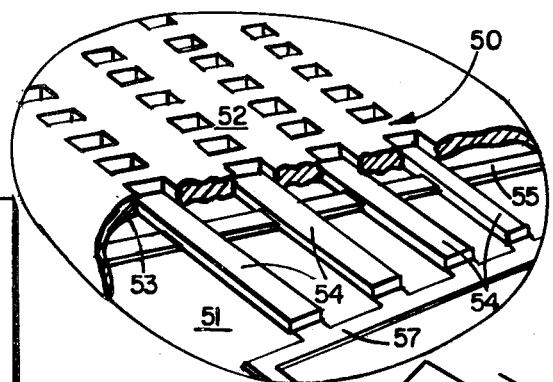
FIG. 7 is a magnified, partial cross section of a portion of the reader assembly of FIG. 6.
Figure 8:
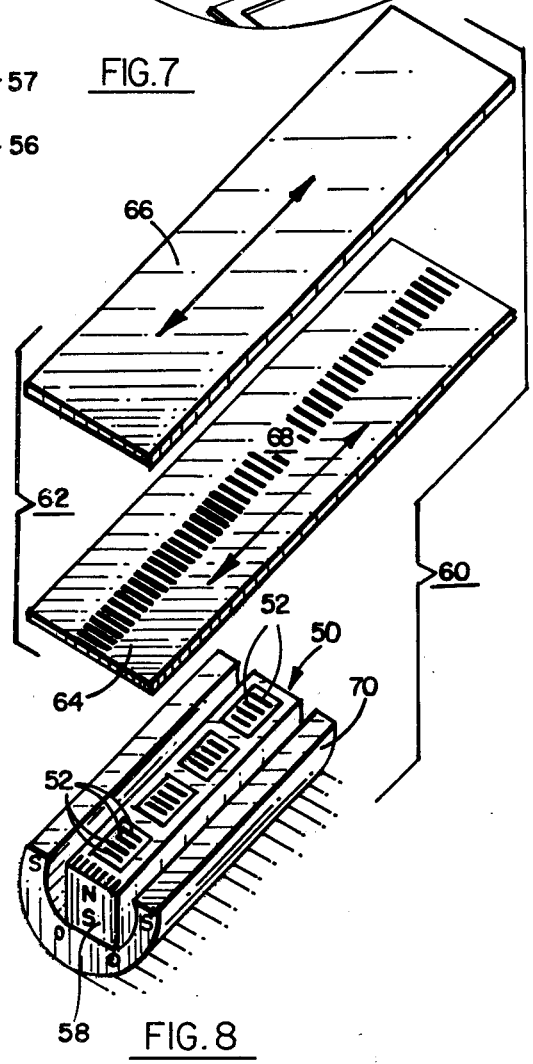
FIG. 8 is an exploded view of the Hall effect linear transducer, including the reader assembly of FIG. 6, formed in accordance with said other embodiment of the present invention.

FIGS. 6–8 show a second preferred embodiment of the Hall effect transducer for sensing a linear dimension, which transducer has reduced size and is fabricated in accordance with conventional microelectronic techniques. Referring to FIGS. 6 and 7, a stationary magnetic reader assembly 50 of the linear transducer is fabricated by growing Hall effect semiconductor material over a suitable substrate 51. A plurality (e.g. four) of arrays 1–4 comprising equally spaced rectangular islands 54 are photo-engraved out of the Hall effect material on substrate 51. The rectangular Hall effect material islands 54 which comprise each of the arrays 1–4, are interconnected in electrical series by means of respective microcircuits 55 to provide cumulative voltage signals at output terminals deposited on substrate 51. An output signal represents the total differential voltage across all of the Hall effect islands 54 which comprise an array thereof. Current is supplied to each of the plurality of rectangular islands 54 by means of current input terminals deposited on substrate 51 and current microbus lines 56 and 57. A thin film layer of insulating dielectric material (not shown) is deposited over the rectangular islands 54. A thicker film 53 of highly permeable magnetic material (having the thickness of the Hall effect islands), such as, for example, permalloy, is vacuum deposited over the insulating thin film. The gaps or spacings between adjacent, rectangular Hall effect islands 54 are filled with the permalloy film to provide efficient magnetic shunting around the islands 54. The permalloy film 53 is photo-engraved in order to form a plurality of patterns of grating bars 52 that are superimposed upon and correspond with respective arrays 1–4 of Hall effect islands 54. The permalloy film and the bars 52 are covered with a suitable insulating sealer. This reader assembly 50 is completed by cementing the substrate 51 to a conventional permanent N-S pole magnet 58.

To provide maximum precision or resolution of measurement, each of the bars patterns are offset with respect to one another. That is, the distances $d_1$, $d_2$, and $d_3$ between a first row of bars 52, which forms one of the grating patterns, and a last row of bars, which forms a preceding pattern, are geometrically increased (e.g. by a factor of 10) with respect to one another.

FIG. 8 is an exploded view of the stationary magnetic reader assembly 50 and a movable magnetic probe assembly 62 which are arranged to form the Hall effect linear transducer 60 of the present embodiment. The movable probe assembly 62 comprises a flat metal ribbon 66, or the like. A magnetic sheet 64, such as a permalloy film, is vacuum deposited upon the ribbon 66. The permalloy film is photo-engraved to produce an array of bars 68 having a uniform spacing corresponding to the spacing between the bars 52 formed in the reader assembly 50.

The reader assembly 50 is cemented to a soft iron armature 70. Armature 70 is uniquely contoured (in a substantial horse shoe configuration) to shape the magnetic field and control flux density around the Hall effect islands when armature 70 is magnetized by pole magnet 58. The movable probe assembly 62 may be conveniently connected to a suitable slide means (not shown).

In operation, to sense a linear dimension, the probe assembly 62 is accordingly moved through a magnetic field established by magnet 58 and armature 70 relative to the Hall effect islands of the stationary reader assembly 50. Accuracy in measurement is obtained, inasmuch as the array of bars 68, formed in the magnetic sheet 64 of the probe assembly 62, encounters the bars 52, formed in the reader assembly 50, in a predetermined order and in accordance with the magnitude of the dimension to be measured and the distances $d_1$, $d_2$, and $d_3$ between successive grating patterns of the reader assembly 50, as explained while referring to FIG. 6. Current may be supplied to the input terminals of the reader assembly 50 (best shown in FIG. 6) by means of a precision power supply. The Hall effect differential voltage signals, the magnitude of which are dependent upon the strength of the magnetic field that is passed to the Hall effect islands when the bars 68 of the probe assembly 62 are moved into alignment with the bars 52 of the reader assembly 50, may be sensed at the output terminals of the reader assembly 50 (also best shown in FIG. 6). The output voltage signals which are indicative of the displacement of the probe assembly 62 and, hence, the linear dimension to be measured, are conditioned and amplified so that the presently described linear transducer 60 can supply digital readout signals to a display or servocontrol information, as required.

It will be apparent that while a preferred embodiment of the invention has been shown and described, various modifications and changes may be made without departing from the true spirit and scope of the invention. For example, it is to be understood that the linear transducer described in the embodiments of the present specification can be adapted to provide an indication of any linear dimension, such as, for example, distance or weight. Moreover, when desirable, the flat movable probe assembly 62 (of FIG. 8) may be replaced by a suitable rotating disk or drum and shaft means having an array of gratings formed thereon. Thus, a compact rotary encoder can also be realized.

Having thus set forth a preferred embodiment of the instant invention, what is claimed is:

1. In combination:
   means to generate a magnetic field,
   a substrate positioned in the magnetic field and having a Hall effect material positioned thereon, said Hall effect material having first terminal means to receive a supply of current to energize said Hall effect material and second terminal means to provide a voltage output signal,
   magnetic field shunt means having an opening formed therein that is dimensioned to receive said Hall effect material, whereby said shunt means surrounds said Hall effect material so that the magnetic field is shunted therearound, and
   first and second grating means, each of said grating means positioned in the magnetic field and adjacent said substrate
   said second grating means adapted to be removed through the magnetic field relative to said first grating means and to said substrate to thereby alter the strength of the magnetic field path that is leaked through respective apertures formed in each of said first and second grating means so as to control the flux density which penetrates said Hall effect material, whereby a displacement of said second grating means is reflected by an output voltage from said Hall effect material, which output voltage corresponds to said displacement.

2. The combination recited in claim 1, wherein said means to generate a magnetic field comprises a pair of magnets,
   one of said magnets connected to said substrate, and
   the second of said magnets connected to said second grating means.

3. The combination recited in claim 1, wherein said means to generate a magnetic field comprises a magnet and an armature, said armature connected to said magnet to be magnetized thereby,
   said magnet connected to said substrate, and
   said armature having an arcuate shape to surround each of said magnet, said substrate and said Hall effect material.

4. The combination recited in claim 1, including an additional substrate, said additional substrate connected to said second grating means.

5. The combination recited in claim 1, wherein each of said first and second grating means comprises a plate fabricated from a permeable magnetic material.

6. The combination recited in claim 1, wherein said first grating means includes a plurality of spaced arrays of grating bars and apertures,
   the distance between successive arrays of said bars and apertures increasing with respect to one another.

7. The combination recited in claim 1, wherein said second grating means comprises an elongated metal strip having a layer of magnetic material positioned on at least one side thereof, said layer of magnetic material including a plurality of grating bars and apertures formed therein.

8. The combination recited in claim 1, wherein said shunt means and said first and second grating means form an enclosure around said Hall effect material, said enclosure being periodically opened to control the flux density through said Hall effect material as said second grating means is moved relative to said first grating means.

9. A linear transducer assembly comprising:
   magnet means to generate a magnetic field,
   a substrate positioned in the magnetic field and having Hall effect material placed thereon, said Hall effect material having first terminal means to receive a supply of current to energize said Hall effect material and second terminal means to provide a voltage output signal,
   magnetic field shunt means to surround said Hall effect material and thereby shunt the magnetic field therefrom, and
   first and second grating means positioned in the magnetic field,
   said first grating means including a plurality of groups of grating bars and apertures, said groups being spaced from one another, the spacing between successive groups of said bars and apertures increasing with respect to one another,
   said second grating means comprising an elongated strip means having a layer of magnetic material on at least one side thereof, said magnetic material including a plurality of grating bars and apertures formed therein,
   said second grating means adapted to be moved through the magnetic field in a substantially parallel plane relative to said first grating means and to said substrate in order to control the magnetic flux density through the respective apertures of said first and second grating means and said Hall effect material, whereby a displacement of said second grating means in accordance with a dimension to be measured is reflected by a corresponding output voltage from said Hall effect material that is indicative of the dimension to be measured.

10. The linear transducer assembly recited in claim 9, wherein said magnet means includes a horseshoe shaped armature connected thereto, said horseshoe shaped armature surrounding said magnet means, said substrate and said first grating means.

* * * * *